US011527626B2

(12) United States Patent
Mayol et al.

(10) Patent No.: US 11,527,626 B2
(45) Date of Patent: Dec. 13, 2022

(54) FIELD-PLATE TRENCH FET AND ASSOCIATED METHOD FOR MANUFACTURING

(71) Applicant: Monolithic Power Systems, Inc., San Jose, CA (US)

(72) Inventors: Ignacio Cortes Mayol, Sant Cugat del Valles (ES); Philippe Godignon, Valldoreix (ES); Victor Soler, Sabadell (ES); Jose Rebollo, Sabadell (ES)

(73) Assignee: Monolithic Power Systems, Inc., San Jose, CA (US)

( * ) Notice: Subject to any disclaimer, the term of this patent is extended or adjusted under 35 U.S.C. 154(b) by 64 days.

(21) Appl. No.: 17/086,000

(22) Filed: Oct. 30, 2020

(65) Prior Publication Data

US 2022/0140092 A1 May 5, 2022

(51) Int. Cl.
*H01L 29/40* (2006.01)
*H01L 29/66* (2006.01)
*H01L 29/78* (2006.01)
*H01L 29/808* (2006.01)

(52) U.S. Cl.
CPC ...... *H01L 29/407* (2013.01); *H01L 29/66893* (2013.01); *H01L 29/7832* (2013.01); *H01L 29/8083* (2013.01)

(58) Field of Classification Search
CPC ............ H01L 29/7813; H01L 29/7827; H01L 29/66666; H01L 29/7811; H01L 29/407
See application file for complete search history.

(56) References Cited

U.S. PATENT DOCUMENTS

| 7,479,672 | B2 | 1/2009 | Zhao | |
|---|---|---|---|---|
| 2014/0117416 | A1 | 5/2014 | Zhang et al. | |
| 2020/0312969 | A1* | 10/2020 | Nagata | H01L 29/7811 |
| 2021/0098620 | A1* | 4/2021 | Tominaga | H01L 29/7805 |

* cited by examiner

*Primary Examiner* — Wasiul Haider
(74) *Attorney, Agent, or Firm* — Perkins Coie LLP

(57) ABSTRACT

A field-plate trench FET having a drain region, an epitaxial layer, a source region, a gate conductive layer formed in a trench, a field-plate dielectric layer formed on vertical sidewalls of the trench, a well region formed below the trench, a source contact and a gate contact. When the well region is in direct physical contact with the gate conductive layer, the field-plate trench FET can be used as a normally-on device working depletion mode, and when the well region is electrically isolated from the gate conductive layer by the field-plate layer, the field-plate trench FET can be used as a normally-off device working in an accumulation-depletion mode.

22 Claims, 12 Drawing Sheets

FIELD-PLATE TRENCH FET AND ASSOCIATED METHOD FOR MANUFACTURING

TECHNICAL FIELD

The present invention generally relates to semiconductor devices, and more particularly but not exclusively relates to a field-plate trench field effect transistor (FET) and associated method for manufacturing.

BACKGROUND

FIG. 1 schematically shows a cross-sectional view of a prior art trench vertical junction field effect transistor (JFET) 100. The JFET 100 comprises an N+ drain region 201 (generally as a semiconductor substrate), an N− epitaxial layer 202 formed on the N+ drain region 201, a U-shaped trench 28 filled with an oxide layer 29, and an N+ source region 203 formed in the N− epitaxial layer 202, wherein the U-shaped trench 28 is surrounded by a P+ gate region 204. The JFET 100 further comprises a source contact 206 and a gate contact 27. The P+ gate region 204 is formed by P-type implantation, which requires a long trench opened window to avoid shadowing. A width W1 between two successive U-shaped trenches 28 would be reduced due to the P-type implantation in vertical sidewalls of the U-shaped trenches 28, thus defining a width W2. A device current controlled by a voltage on the gate contact 27 is then performed with a lateral depletion of a defined vertical P/N junction. The P-type implantation inside the N+ source region 203 forms a N+/P+ junction close to the source contact 206, which could result a high gate to source leakage and a low gate to source breakdown. Besides, a U-shaped trench formation and the P-type implantation can result a high variability between two different JFET chips fabricated on a wafer, especially when the semiconductor substrate of the JFET chips is Silicon Carbide. Furthermore, this JFET 100 is only aimed to be a normally-on device which needs a contribution of a silicon normally-off MOSFET in cascode configuration for a gate control, wherein "in cascode configuration" means a JFET is coupled in series with a MOSFET, wherein a drain terminal of the MOSFET is coupled to a source terminal of the JFET, and a gate terminal of the JFET is coupled to a source terminal of the MOSFET. The gate terminal of the MOSFET serves as the gate terminal of the cascode configuration, the source terminal of the MOSFET serves as the source terminal of the cascode configuration, and the drain terminal of the JFET serves as the drain terminal of the cascode configuration.

Therefore, it would be desired to design a FET with better capabilities than the prior art JFET 100, e.g. with multiple bias configurations, a lower gate to source leakage, a higher breakdown capability and a lower on resistance.

SUMMARY

An embodiment of the present invention discloses a field-plate trench FET, comprising: a drain region of a first conductivity type; an epitaxial layer of the first conductivity type formed on the drain region; a source region of the first conductivity type formed in the epitaxial layer; a trench filled with a gate conductive layer and a field-plate dielectric layer, wherein the gate conductive layer is formed below a top surface of the source region, and the field-plate dielectric layer is formed on vertical sidewalls of the trench; a well region of a second conductivity type formed below the trench; a gate contact formed on the gate conductive layer; and a source contact formed on the source region; wherein the well region is in direct physical contact with the gate conductive layer or isolated from the gate conductive by the field-plate dielectric layer.

An embodiment of the present invention discloses a method for fabricating a field-plate trench FET, comprising: forming an epitaxial layer of a first conductivity type on a drain region; forming a source region of the first conductivity type in the epitaxial layer; forming a trench in the epitaxial layer; forming a well region of a second conductivity type below the trench; forming a dielectric layer; defining a field-plate dielectric layer by removing the dielectric layer from a bottom of the trench and a top surface of the source region; forming a gate conductive layer in the trench; and forming a gate contact on the gate conductive layer and a source contact on the source region.

An embodiment of the present invention discloses a method for fabricating a field-plate trench FET, comprising: forming an epitaxial layer of a first conductivity type on a drain region; forming a source region of the first conductivity type in the epitaxial layer; forming a trench in the epitaxial layer; forming a well region of a second conductivity type below the trench; forming a dielectric layer; forming a gate conductive layer below a bottom of the source region or below a top surface of the source region; defining a field-plate dielectric layer by removing the dielectric layer from the top surface of the source region; and forming a gate contact on the gate conductive layer and a source contact on the source region.

The design of this field-plate trench FET may provide a lower gate to source leakage because there is no N+/P+ source/gate junction, a smaller device geometry, and a lower on resistance because no P-type implantation in vertical sidewalls is needed and the trench is filled with the gate conductive layer (e.g. a polysilicon layer). The well region can be in direct physical contact with the gate conductivity layer by etching the dielectric layer at the bottom of the trench, so as to produce a normally-on FET device working in a depletion mode. Furthermore, the well region can be electrically isolated from the gate conductivity layer if the dielectric layer at the bottom of the trench is not etched before forming the gate conductive layer, and the well region can be connected to a well contact and being independently biased to produce a normally-off FET working in an accumulation-depletion mode (i.e. working in an accumulation mode or the depletion mode).

BRIEF DESCRIPTION OF THE DRAWINGS

Non-limiting and non-exhaustive embodiments are described with reference to the following drawings. The drawings are only for illustration purpose. Usually, the drawings only show part of the system or circuit of the embodiment, and the same reference label in different drawings have the same, similar or corresponding features or functions.

DETAILED DESCRIPTION

The embodiments of the present invention are described in the next paragraphs. While the invention will be described in conjunction with various embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the embodiments of the present invention, numerous specific details are set forth in order to provide a thorough understanding of the embodiments of the present invention. However, it will be obvious to one of ordinary skill in the art that without these specific details the embodiments of the present invention may be practiced. And it should be noted that well-known circuits, materials, and methods are not described in detail so as not to unnecessarily obscure aspect of the embodiments of the present invention.

In the specification and appended claims, "on", "in", "into" "onto", "below", "on the top of", "in the front of", "right", "left" and/or the like terms may be employed to describe relative positions of related elements, but not to add absolute restrictions to the elements. For example, when one layer is described "on" the other layer, it means one layer may be located on the other one directly, or additional layers may exist between them. Though "region" or "regions", "trench" or "trenches", "pad" or "pads" and other similar terms are referred to in the description with singular or plural forms, it is not confined to the singular or plural numbers, and any number is considered in the embodiments. The semiconductor device may comprise a field effect transistor, a bipolar junction transistor and/or other similar devices, thus, the "gate/gate region", "source/source region", and "drain/drain region" may comprise "base/base region", "emitter/emitter region", and "collector/collector region" respectively, and may further comprise structures similar as the "gate/gate region", "source/source region", and "drain/drain region".

Figure 1:
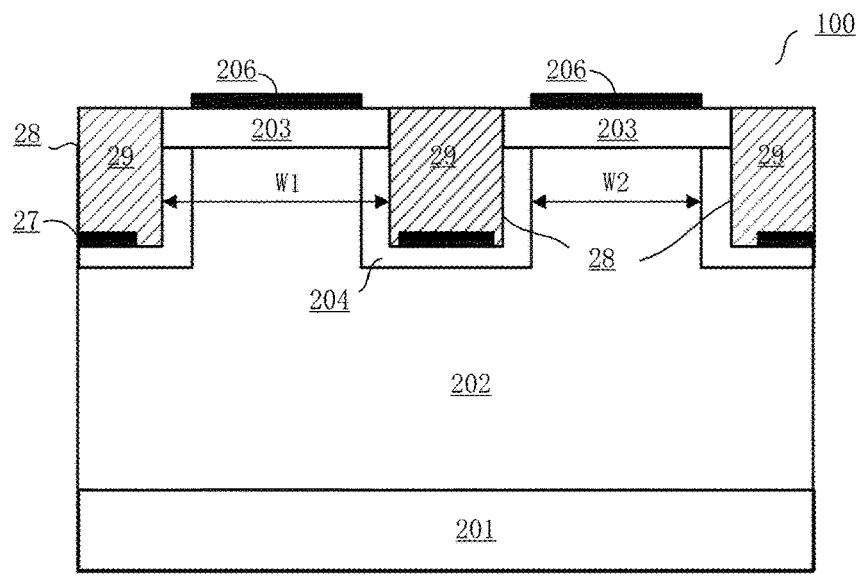
FIG. 1 schematically shows a cross-sectional view of a prior art JFET 100.
Figure 2:
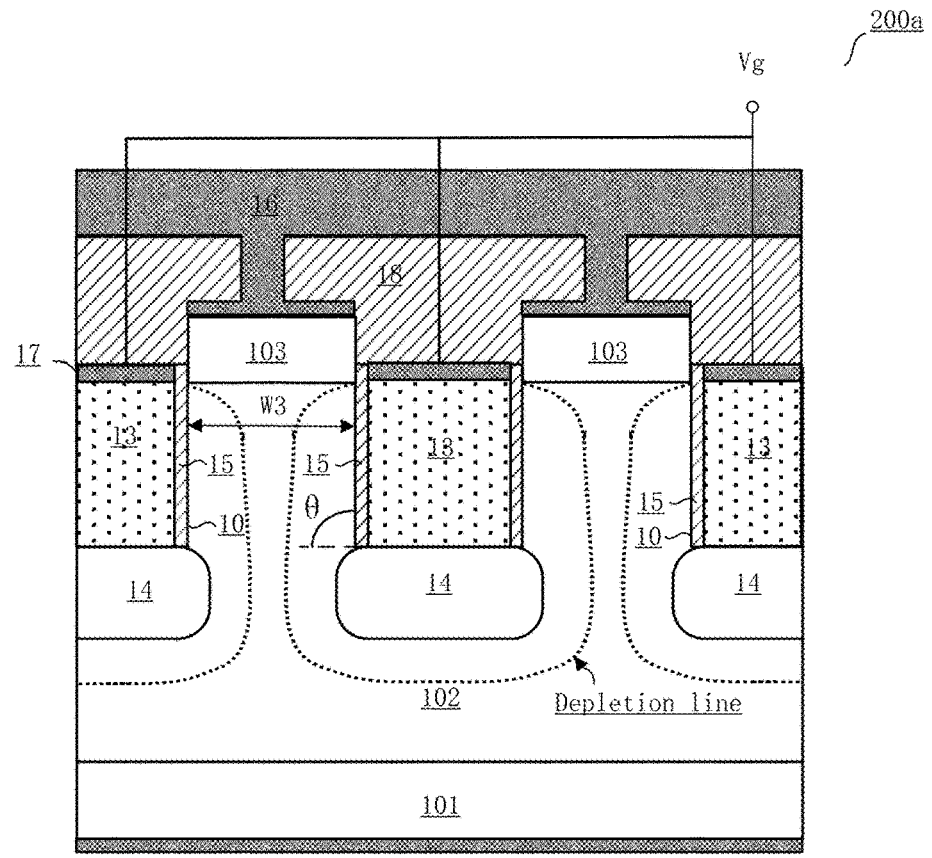
FIG. 2 schematically shows a cross-sectional view of a field-plate trench FET 200a according to an embodiment of the present invention.

FIG. 2 schematically shows a cross-sectional view of a field-plate trench FET 200a according to an embodiment of the present invention. The field-plate trench FET 200a comprises a drain region 101 of a first conductivity type (e.g. N+ type), an epitaxial layer 102 of the first conductivity type (e.g. N− type) formed on the drain region 101, a source region 103 of the first conductivity type (e.g. N+ type) formed in the epitaxial layer 102, a gate conductive layer 13 of the first conductivity type or the second conductivity type (e.g. N+ type or P+ type) formed in a trench 10 and below a top surface of the source region 103, a field-plate dielectric layer 15 formed on vertical sidewalls of the trench 10, wherein the trench 10 is filled with the gate conductive layer 13 and the field-plate dielectric layer 15, and for example, the field-plate dielectric layer 15 may comprise Silicon Oxide (SiO2), the gate conductive layer 13 may comprise polysilicon. The field-plate trench FET 200a further comprises a well region 14 of the second conductivity type (e.g. P+ type) formed below the gate conductive layer 13, a source contact 16 formed on the source region 103, a gate contact 17 formed on the gate conductive layer 13, and a dielectric layer 18 covering the trench 10 and the gate contact 17. In an embodiment of the present invention, the gate conductive layer 13 is electrically isolated from the source region 103 by the field-plate dielectric layer 15 thus highly reducing a gate to source leakage. In an embodiment of the present invention, the field-plate dielectric layer 15 is adjacent to the source region 103. The drain region 101 may comprise doped silicon carbide (SiC), silicon (Si), Silicon-Germanium (SiGe), and/or any other suitable semiconductor material.

In the embodiment shown in FIG. 2, a lower on resistance than the prior art JFET 100 can be achieved since the trench 10 and the width W3 of the field-plate trench FET 200a can be further shrunk because no P-type tiled implantation in vertical sidewalls is needed for the channel depletion and the trench 10 is filled with the gate conductive layer (e.g. a polysilicon layer). In an embodiment of the present invention, the trench 10 is U-shaped and with high slope vertical sidewalls, e.g. an angle θ of the vertical sidewalls can be 86°/90°, in other embodiments of the present invention, the trench 10 is with higher slope vertical sidewalls than 86° sidewalls, i.e. the angle θ is larger than 86°, wherein a vertical sidewall with a slope lower than 86° may bring: unexpected surface P-type layer will be formed at the vertical sidewalls of the trench 10 when the well region 14 is implanted, which could shorten the width W3 (i.e. device channel width) between two successive field-plate dielectric layers 15 and increase the on resistance. In other embodiments of the present invention, trench process variation and optimal design for parameters (e.g. a thickness of the field-plate dielectric layer 15, the width W3 and defined initial epitaxial-channel concentration in the epitaxial layer 102) can bring an optimal breakdown voltage versus on resistance trade-off.

In an embodiment shown in FIG. 2, the gate conductive layer 13 is in direct physical contact with the well region 14 to obtain better channel pinch-off and breakdown capability. In an embodiment of the present invention, the gate conductive layer 13 is formed at a bottom of the source region 103 or even below the bottom of the source region 103 to reduce a gate to source capacitance. By appropriate configurations, the field-plate trench FET 200a can be used as a normally-on device working in a depletion mode, e.g. at an off-state, applying a first bias voltage (e.g. a gate signal Vg=−15V) at the gate contact 17, and at an on-state, applying a second bias voltage (e.g. the gate signal Vg=0V) at the gate contact 17 to realize typical working conditions (e.g. as a normally-on FET device working in the depletion mode). In the embodiment shown in FIG. 2, a gate control of the field-plate trench FET 200a is performed with a lateral channel depletion (i.e. a depletion line shown in FIG. 2 is lateral when a gate signal Vg is negative, e.g. the gate signal Vg=−4V) thanks to the gate conductive layer 13, and in an embodiment of the present invention, the field-plate trench FET 200a configured with a silicon MOSFET in cascode can be used as a standard gate driver.

Figure 3:
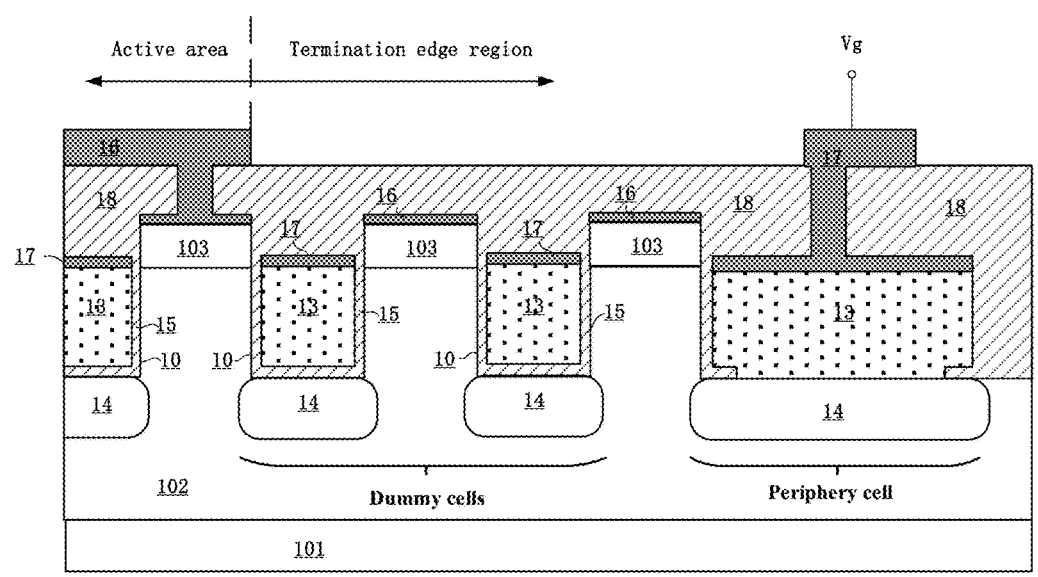
FIG. 3 schematically shows a cross-sectional view of a field-plate trench FET 200b according to an embodiment of the present invention.

FIG. 3 schematically shows a cross-sectional view of a field-plate trench FET 200b according to an embodiment of the present invention. Different with the field-plate trench FET 200a shown in FIG. 2, in the field-plate trench FET 200b, the gate conductive layer 13 is in direct physical contact with the well region 14 only in a termination edge region, which can improve a reliability of the field-plate dielectric layer 15, reduce the gate to source leakage, and reduce a gate to drain capacitance. As shown in FIG. 3, the field-plate trench FET 200b comprises an active area and the termination edge region, wherein in the active area, the gate conductive layer 13 is isolated from the well region by the field-plate dielectric layer 15, and in the termination edge region, only in a periphery cell, the gate conductive layer 13 is in direct physical contact with the well region 14. In the embodiment shown in FIG. 3, the field-plate trench FET 200b comprises two dummy cells in the termination edge region, but in other embodiments of the present invention, the number of the dummy cells is not limited to two. Wherein the dummy cells are not connected to the source contact 16 and they are used to avoid excessive current density at the termination edge region.

Figure 4:
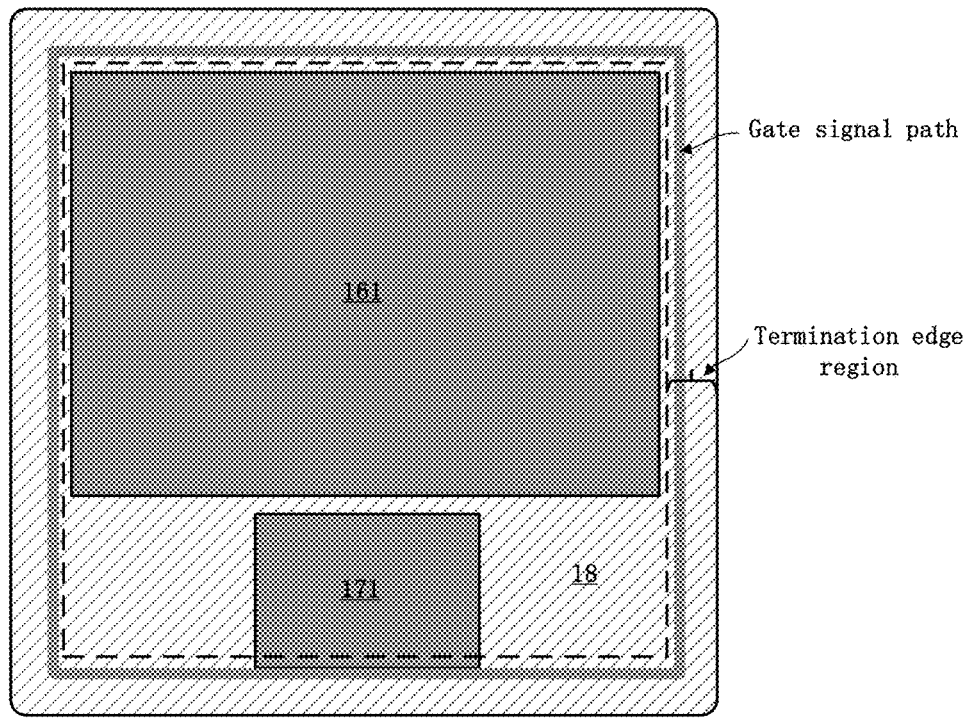
FIG. 4 schematically shows a top view of a field-plate trench FET chip 200c shown according to an embodiment of the present invention.

FIG. 4 schematically shows a top view of a field-plate trench FET chip 200c shown according to an embodiment of the present invention, wherein the field-plate trench FET chip 200c can comprise the field-plate trench FET 200a or the field-plate trench FET 200b. As the embodiment shown in FIG. 4, the field-plate trench FET chip 200c comprises two bonding pads on its top (a source bonding pad 161 for the source contact 16 and a gate bonding pad 171 for the gate contact 17), which allows the field-plate trench FET chip 200c to be easily packaged along with a MOSFET in cascode. In the embodiment shown in FIG. 4, a gate signal path for the gate signal Vg is located around in the termination edge region, and the gate signal path is connected to the gate bonding pad 171.

Figure 5:
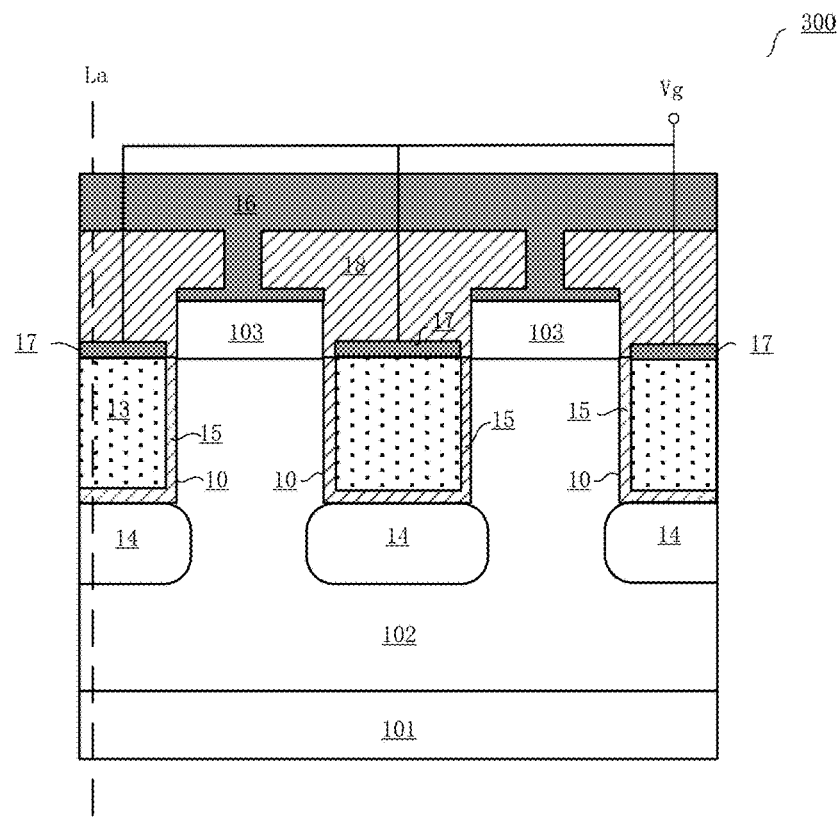
FIG. 5 schematically shows a cross-sectional view of a field-plate trench FET according to another embodiment of the present invention.

FIG. 5 schematically shows a cross-sectional view of a field-plate trench FET 300 according to another embodiment of the present invention. A difference between the field-plate trench FET 300 with the field-plate trench FET 200a is that the well region 14 in the field-plate trench FET 300 is formed under the field-plate dielectric layer 15 on the bottom of the trench 1, i.e. the well region 14 in the field-plate trench FET 300 is electrically isolated from the gate conductive layer 13 by the field-plate dielectric layer 15.

Figure 6:
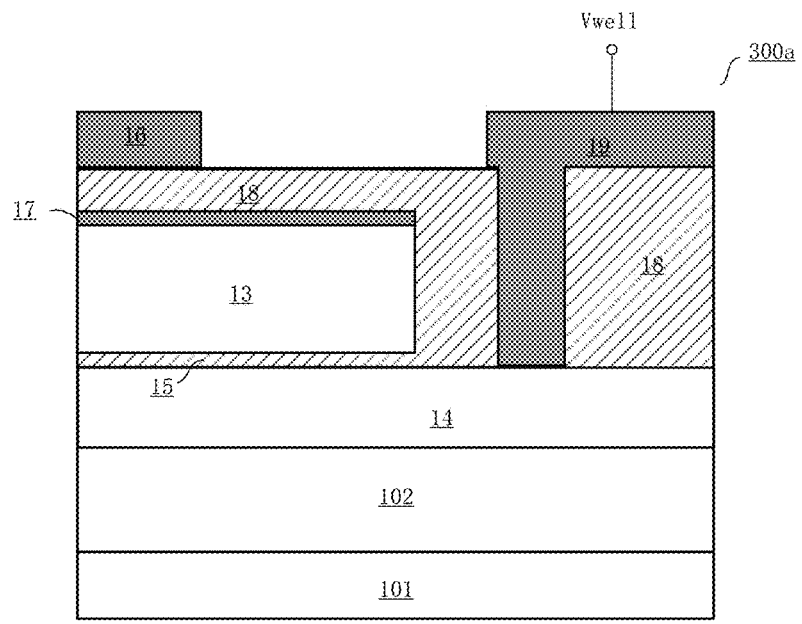
FIG. 6 schematically shows a cross-sectional view 300a of the field-plate trench FET 300 along a dotted line La shown in FIG. 5 according to an embodiment of the present invention.

FIG. 6 schematically shows a cross-sectional view 300a of the field-plate trench FET 300 along a dotted line La shown in FIG. 5 according to an embodiment of the present invention. In the embodiment shown in FIG. 6, the well region 14 is connected to an independent well contact 19 formed on the well region 14.

Figure 7:
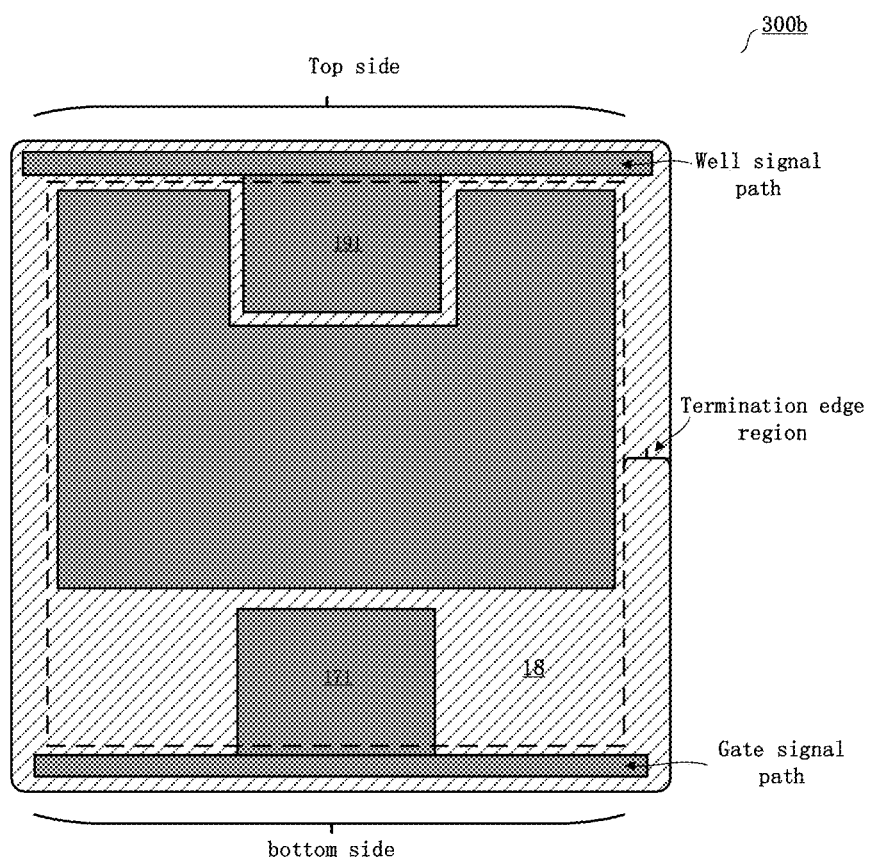
FIG. 7 schematically shows a top view of a field-plate trench FET chip 300b shown according to an embodiment of the present invention.

FIG. 7 schematically shows a top view of a field-plate trench FET chip 300b shown according to an embodiment of the present invention, wherein the field-plate trench FET chip 300b can comprise the field-plate trench FET 300. In the embodiment shown in FIG. 7, the field-plate trench FET chip 300b comprises three bonding pads (the source bonding pad 161 for the source contact 16, the gate bonding pad 171 for the gate contact 17 and a well bonding pad 191 for the well contact 19), a well signal path for the well signal Vwell designed along a top side of the chip 300b, and a gate signal path for the gate signal Vg designed along a bottom side of the chip 300b, wherein the well signal path is connected to the well bonding pad 191.

Figure 8:
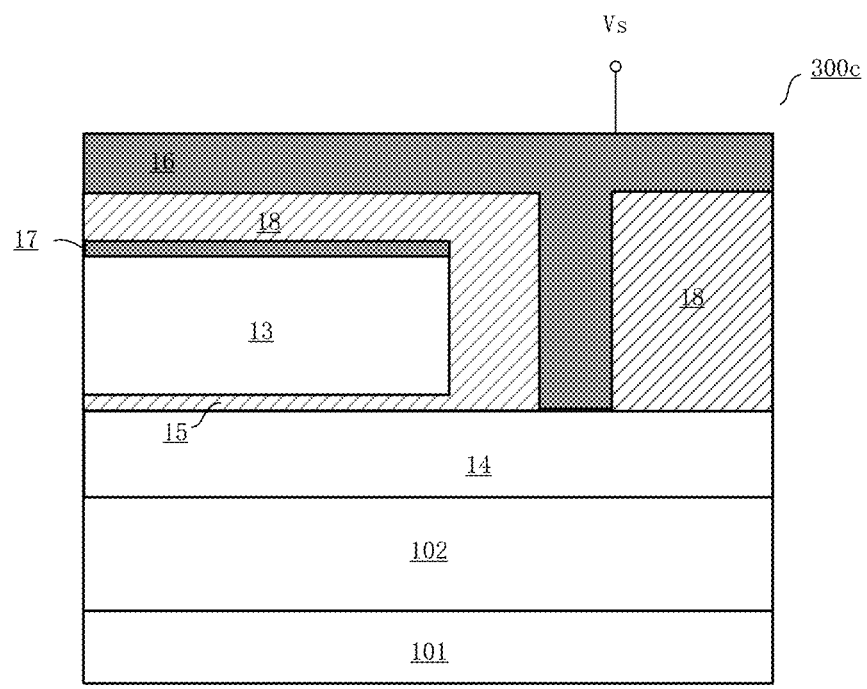
FIG. 8 schematically shows a cross-sectional view 300c of the field-plate trench FET 300 along the dotted line La shown in FIG. 5 according to another embodiment of the present invention.

FIG. 8 schematically shows a cross-sectional view 300c of the field-plate trench FET 300 along the dotted line La shown in FIG. 5 according to another embodiment of the present invention. In the embodiment shown in FIG. 8, the well region 14 is connected to the source contact 16, i.e. the source contact 16 is connected to the well contact 19 shown in FIG. 6. In an embodiment of the present invention, the well region 14 is grounded through the source contact 16, and with the well region 14 grounded, the field-plate trench FET 300 can also operate under a positive bias voltage at the gate contact 16. Wherein a source voltage Vs can be added on the source contact 16.

In the embodiment shown in FIG. 5-FIG. 7, the field-plate trench FET 300 can be used as a normally-off device working in an accumulation-depletion mode, e.g., at the off-state (i.e. working in the depletion mode), applying a third bias voltage (e.g. a gate signal Vg=−5V) at the gate contact 17 and applying a fourth bias voltage (e.g. a well signal Vwell=−15V) at the well contact 19 for the well region 14, wherein in an embodiment of the present invention, the third bias voltage is 10V greater than the fourth bias voltage, and at the on-state (i.e. working in the accumulation mode), applying a fifth bias voltage (e.g. the gate signal Vg=10V) at the gate contact 17 and applying a sixth bias voltage (e.g. the well signal Vwell=0V) at the well contact 19 for the well region, wherein in an embodiment of the present invention, the fifth bias voltage is 10V greater than the sixth bias voltage. In the embodiment shown in FIG. 5-7, the on resistance can be further reduced due to the independent well contact 19 for the well region 14, which enables the accumulation mode at a channel region.

Figure 9:
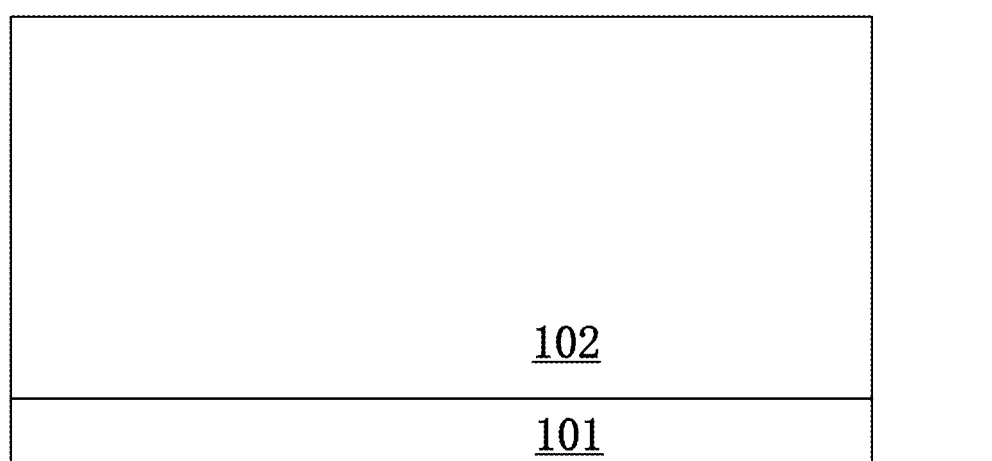
FIGS. 9-18 schematically show cross-sectional views illustrating a method for fabricating a field-plate trench FET according to an embodiment of the present invention.

FIGS. 9-18 schematically show cross-sectional views illustrating a method for fabricating a field-plate trench FET according to an embodiment of the present invention. The method comprises steps S01, S02, S03, S04, S05, S06A, S07A, S07A', S08A and S09A as follows:

At step S01, as the embodiment in FIG. 9 shown, forming the epitaxial layer 102 of the first conductivity type (e.g. N− type) on the drain region 101 of the first conductivity type (e.g. SiC N+ substrate).

Figure 10:
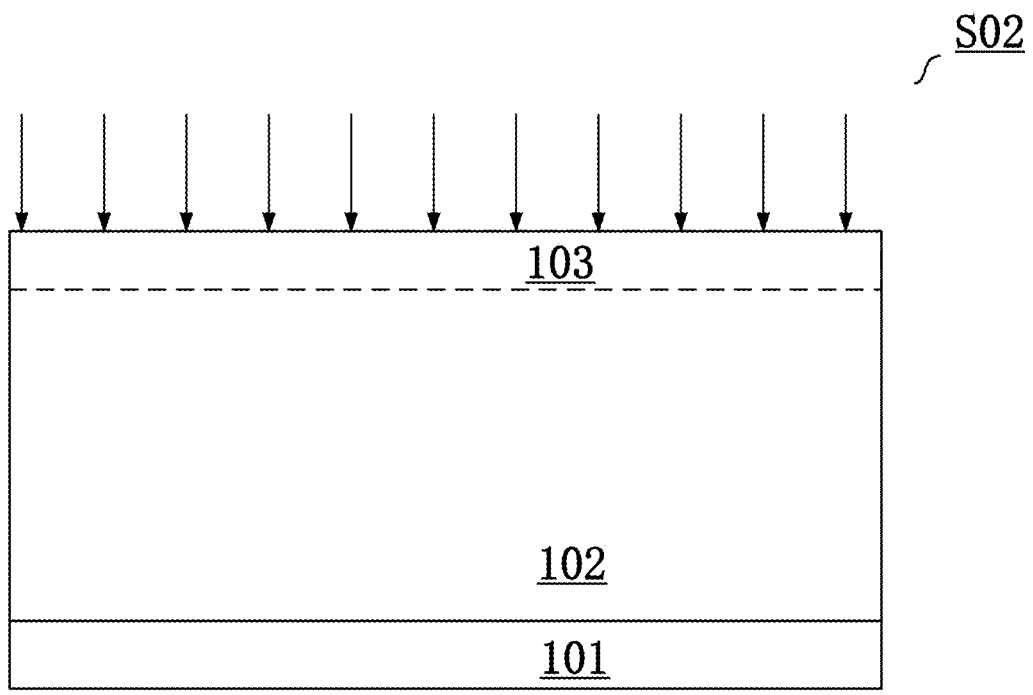

At step S02, as the embodiment in FIG. 10 shown, forming the source region 103 of the first conductivity type (e.g. N+ type) in the epitaxial layer 102 by implanting. In an embodiment of the present invention, the step S02 can be completed at room temperature.

Figure 11:
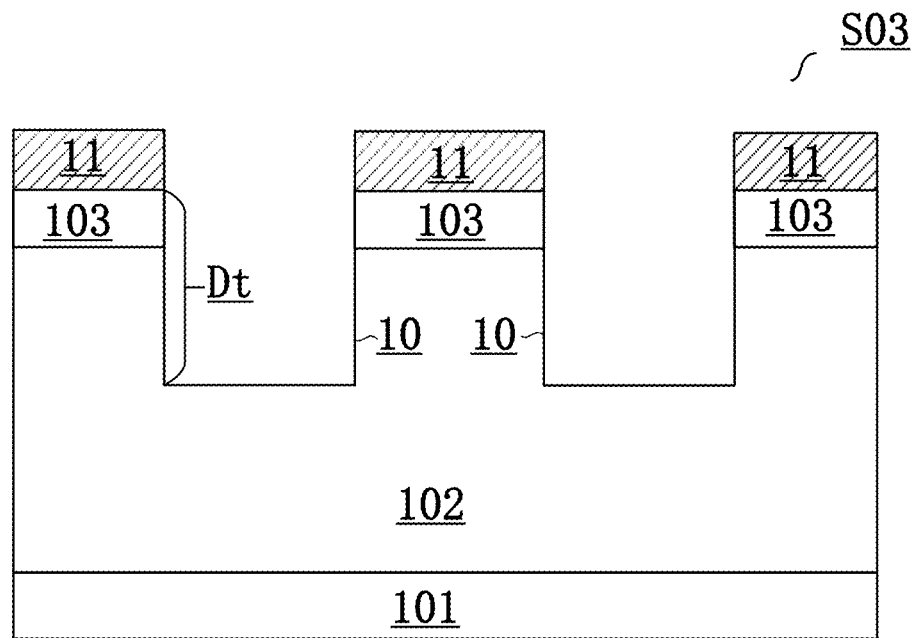

At step S03, as the embodiment in FIG. 11 shown, forming the trench 10 in the epitaxial layer 102. In an embodiment of the present invention, the process of forming the trench 10 comprises a trench mask layer 11 definition and a dry SiC etch for defining the trench 10, wherein a trench depth Dt of 1 μm to 5 μm can be defined. The trench mask layer 11 may be deposited on the source region 103 and then patterned based on the number of the FETs that is desired/designed. In FIG. 11, although the trench mask layer 11 is exemplarily patterned for forming two FETs, this is not intended to be limiting. In other embodiments of the present invention, any suitable number of FETs may be employed. In an embodiment of the present invention, the trench mask layer 11 may comprise a hard mask (e.g. a nitride layer, and/or silicon oxide layer) and/or a soft mask (e.g. photoresist). In an embodiment of the present invention, etching the epitaxial layer 102 may include a reactive ion etching (RIE) process. The RIE process may also be performed to etch the trench/trenches 102 of any suitable depth and/or width.

Figure 12:
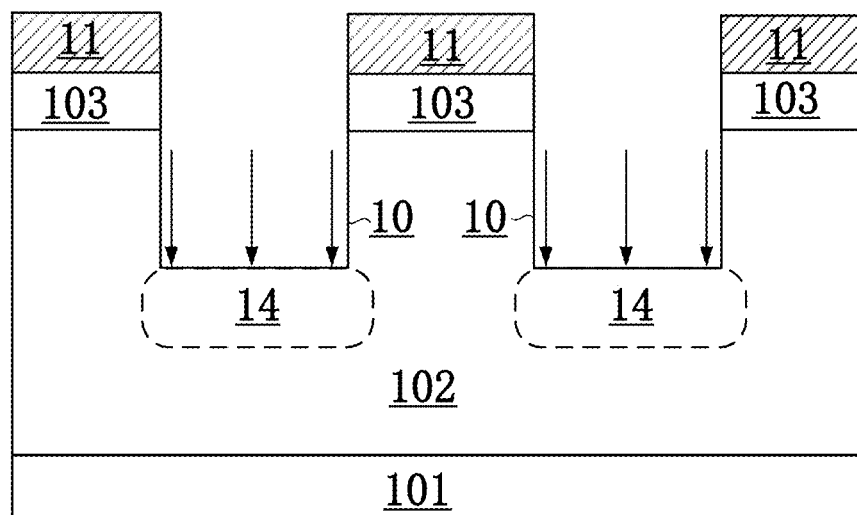

At step S04, as the embodiment in FIG. 12 shown, forming the well region 14 of the second conductivity type below the trench 10. In an embodiment of the present invention, ions of the second conductivity type may be implanted into the epitaxial layer 102 through the trench/trenches 10 to form the well region 14. In an embodiment of the present invention, P+ type ions (e.g. Aluminum or Boron) may be implanted into the epitaxial layer 102 by a multi-implantation process. In an embodiment of the present invention, the method further comprises etching the trench mask layer 11 and well annealing to form the well region 14.

Figure 13:
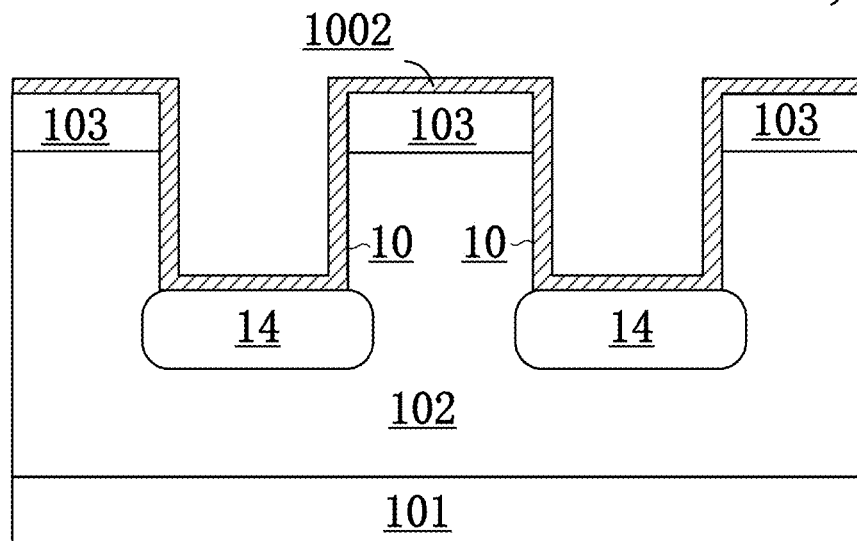

At step S05, as the embodiment in FIG. 13 shown, forming a dielectric layer 1002 (e.g. an oxide layer) on a top surface of the device after the step S04. In an embodiment of the present invention, the dielectric layer 1002 is defined by thermal oxidation and/or deposition, a thickness of the dielectric layer 1002 (e.g. 50 nm to 150 nm) would depend on practical applications.

Figure 14:
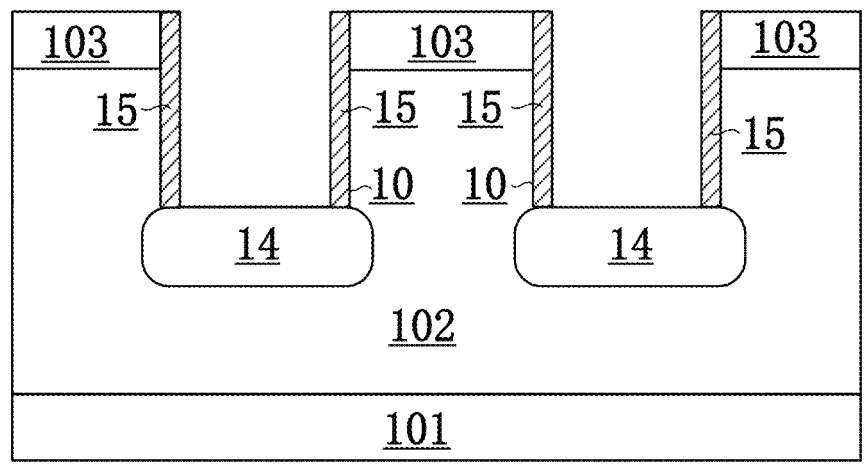

At step S06A, as the embodiment in FIG. 14 shown, defining a gate field-plate dielectric layer 15 (e.g. a field-plate oxide layer) by removing the dielectric layer 1002 from the bottom of the trench 10 and the top surface of the source region 103. In an embodiment of the present invention, the dielectric layer 1002 shown in FIG. 13 may be removed from the bottom of the trench 10 and the top surface of the source region 11 by anisotropic etching, and the dielectric layer 1002 left after the anisotropic etching forms the field-plate dielectric layer 15 shown in FIG. 14.

Figure 15:
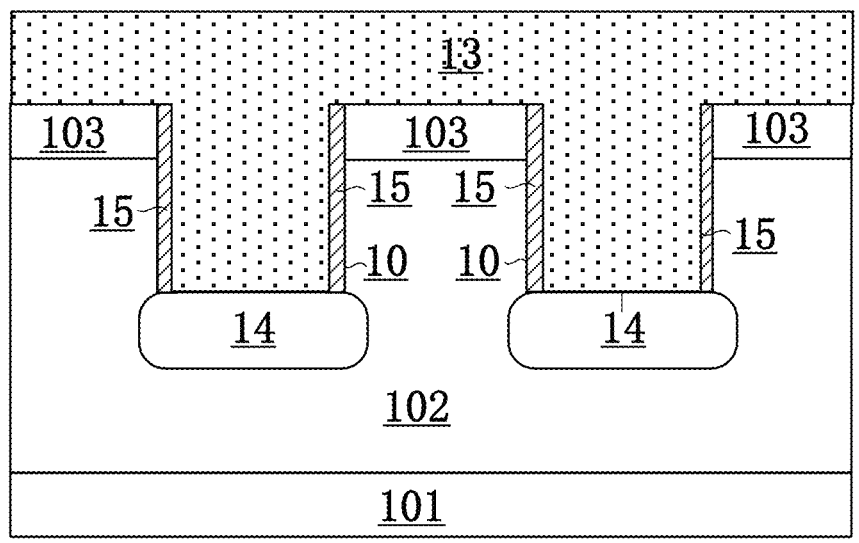
Figure 16:
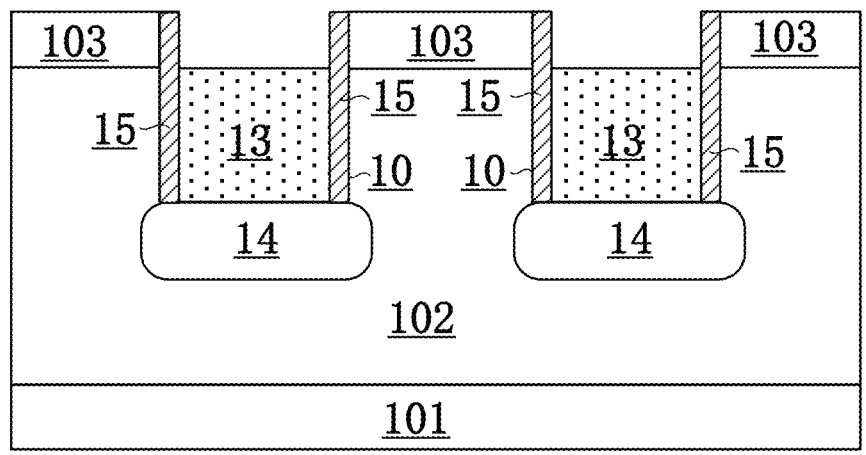

At step S07A, as the embodiment in FIG. 15 shown, forming a gate conductive layer 13 in the trench 10. In an embodiment of the present invention, the step S07A comprises a process of depositing polysilicon with N+/P+ type doped. In another embodiment of the present invention, to reduce the gate to source capacitance, after the step S07A, the method further comprises a step S07A' shown in FIG. 16, a process of anisotropic polysilicon recess etching to form the gate conductive layer 13 below the top surface of the source region 103 (e.g. etching the gate conductive layer 13 back to the bottom of the source region 103). In an embodiment of the present invention, the gate conductive layer 13 is with N+ type doped to obtain a higher depletion when a reverse voltage is applied on the device.

Figure 17:
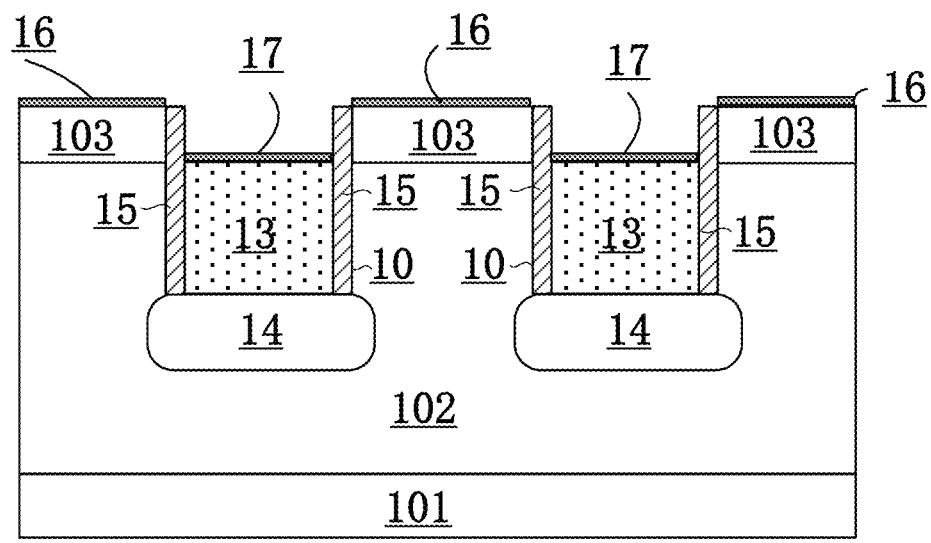

At step S08A, as the embodiment in FIG. 17 shown, forming the gate contact 17 on the gate conductive layer 13 and the source contact 16 on the source region 103 by source metallization and gate metallization. In an embodiment of the present invention, the step S08A comprises Nickel deposition on the top surface of the source region 103 and on the top surface of the gate conductive layer 13. Afterwards, the dielectric layer 18 is deposited to isolate the gate contact 17 from the source contact 16. The final contact opening formation is shown at the step S09A in the FIG. 18.

Figure 18:
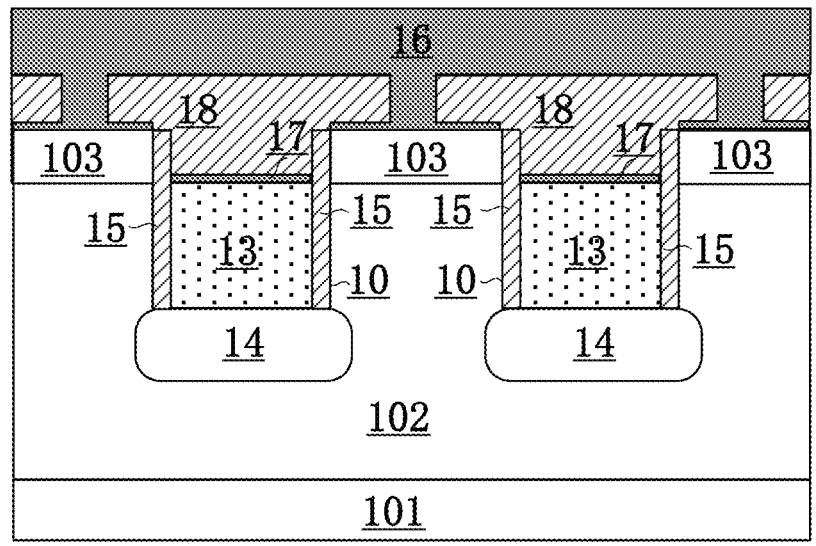

In the embodiment shown in FIG. 18, the device corresponds to the field-plate trench FET 200a, wherein the well region 14 is in direct physical contact with the gate conductive layer 13, and when the second bias voltage is applied at the gate contact 17, the field-plate trench FET is used as a normally-on device working in the depletion mode.

Figure 19:
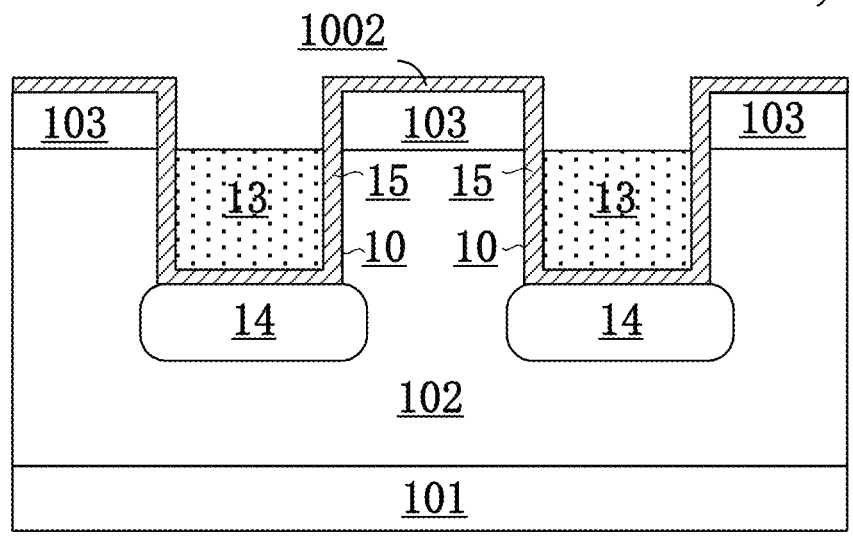
FIGS. 19-22 schematically show cross-sectional views illustrating another method for fabricating a field-plate trench FET according to another embodiment of the present invention.

FIGS. 19-22 schematically show cross-sectional views illustrating another method for fabricating a field-plate trench FET according to another embodiment of the present invention. After the steps S01-S05 shown in FIG. 9-FIG. 13, the method further comprises steps S06B-S09B as follows:

At step S06B, as the embodiment in FIG. 19 shown, after the step S05, the step S06B comprises forming a gate conductive layer 13 of the first conductivity type or the second conductivity type below the bottom of the source region 103 or below the top surface of the source region 103. In an embodiment of the present invention, the step S06B comprises a process of depositing polysilicon with N+/P+ type and a process of anisotropic polysilicon recess etching to form the gate conductive layer 13 below the top surface of the source region 103 (e.g. etching the gate conductive layer 13 back to the bottom of the source region 103).

Figure 20:
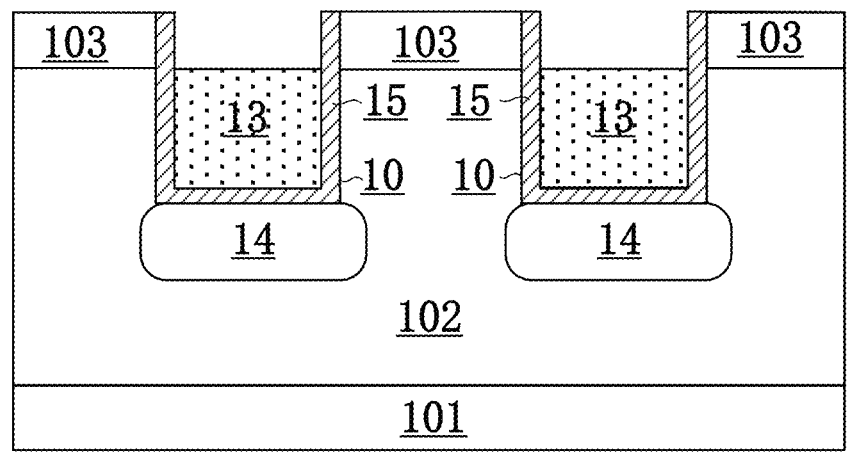

At step S07B, as the embodiment in FIG. 20 shown, defining the field-plate dielectric layer 15 by removing the dielectric layer 1002 from the top surface of the source region 103. In the embodiment as shown in FIG. 20, the dielectric layer 1002 is not removed from the bottom of the trench 10, and the dielectric layer 1002 left after the removing forms the field-plate dielectric layer 15. In the embodiment shown in FIG. 20, the field-plate dielectric layer 15 can be formed by anisotropic etching.

Figure 21:
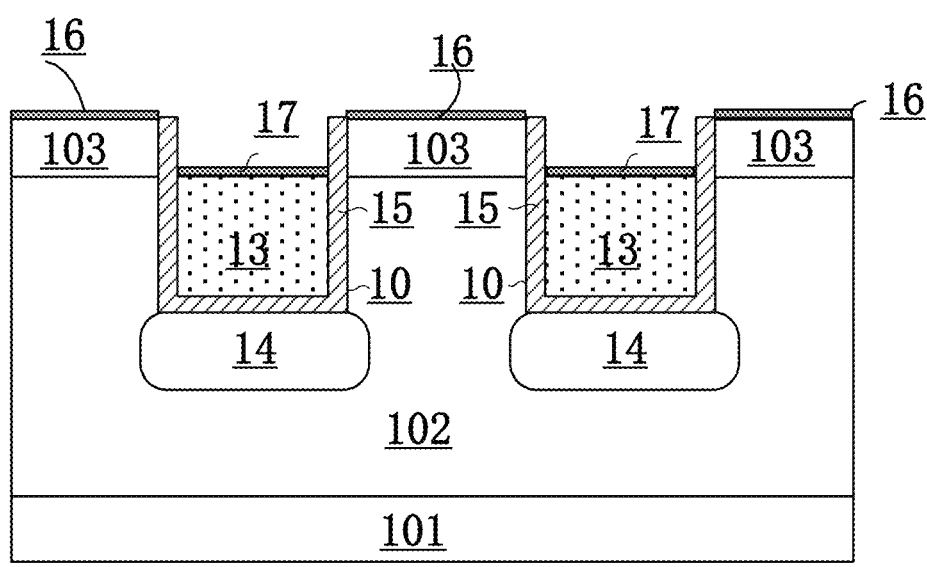

At step S08B, as the embodiment in FIG. 21 shown, forming the gate contact 17 on the gate conductive layer 13 and the source contact 16 on the source region 103 by source metallization and gate metallization. Afterwards, the dielectric layer 18 is deposited to isolate the gate contact 17 from the source contact 16. The final contact opening formation is shown at the step S09B in the FIG. 22.

Figure 22:
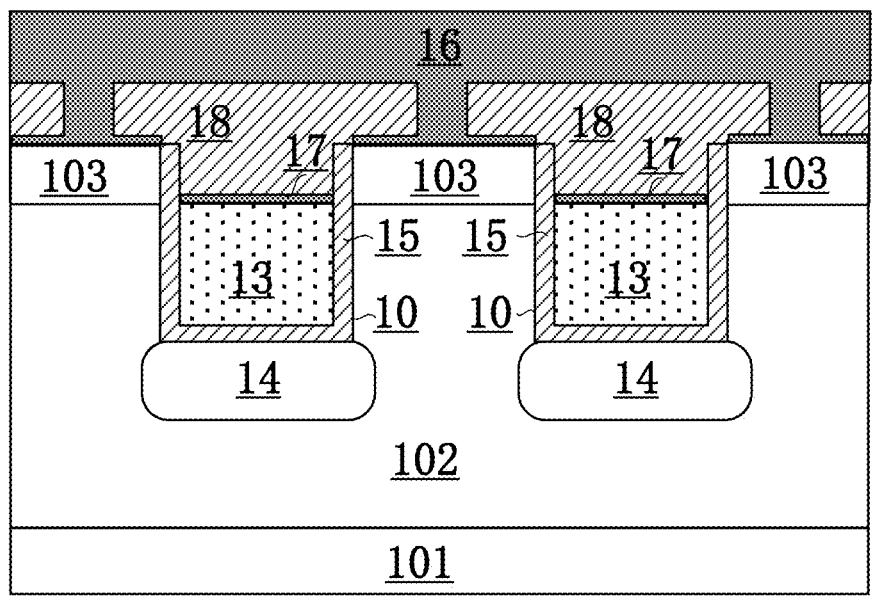

In the embodiment shown in FIG. 22, the device corresponds to the field-plate trench FET 300, wherein the well region 14 is electrically isolated from the gate conductive layer 13 by the field-plate dielectric layer 15, and the well region 14 is connected to the well contact 19. When the fifth bias voltage is applied at the gate contact 17 and the sixth bias voltage is applied at the well contact 19, the field-plate trench FET is used as a normally-off device working in the accumulation-depletion mode.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

We claim:

1. A field-plate trench FET, comprising:
a drain region of a first conductivity type;
an epitaxial layer of the first conductivity type formed on the drain region;
a source region of the first conductivity type formed in the epitaxial layer;
a trench filled with a gate conductive layer and a field-plate dielectric layer, wherein the gate conductive layer is formed below a top surface of the source region, and the field-plate dielectric layer is formed on vertical sidewalls of the trench;
a well region of a second conductivity type formed below the trench;
a gate contact formed on the gate conductive layer;
a source contact formed on the source region; and
an independent well contact formed on the well region, the well region is capable of being independently biased by the well contact; wherein
the well region is isolated from the gate conductive layer by the field-plate dielectric layer.

2. The field-plate trench FET of claim 1, wherein when the well region is in direct physical contact with the gate conductive layer, and when a first bias voltage is applied at the gate contact, the field-plate trench FET is configured to be used as a normally-on device working in a depletion mode.

3. The field-plate trench FET of claim 1, wherein the well region is in direct physical contact with the gate conductive layer only in a termination edge region.

4. The field-plate trench FET of claim 1, wherein the field-plate dielectric layer is further formed on a bottom of the trench, and the well region is formed under the field-plate dielectric layer on the bottom of the trench.

5. The field-plate trench FET of claim 4, wherein when a second bias voltage is applied at the gate contact and a third bias voltage is applied at the well contact, the field-plate trench FET is configured to be used as a normally-off device working in an accumulation-depletion mode.

6. The field-plate trench FET of claim 5, wherein the well contact is configured to be connected to the source contact.

7. The field-plate trench FET of claim 1, wherein the trench is configured to be a U-shaped trench with higher than 86° slope of the vertical sidewalls.

8. The field-plate trench FET of claim 1, wherein a gate control of the field-plate trench FET is configured to be performed with a lateral channel depletion.

9. The field-plate trench FET of claim 1, wherein the gate conductive layer is formed at a bottom of the source region.

10. The field-plate trench FET of claim 1, wherein the field-plate dielectric layer is formed between the gate conductive layer and the source region.

11. The field-plate trench FET of claim 1, wherein the field-plate dielectric layer comprises silicon oxide, and the gate conductive layer comprises polysilicon.

12. The field-plate trench FET of claim 1, wherein the gate conductive layer is electrically isolated from the source region by the field-plate dielectric layer.

13. The field-plate trench FET of claim 1, wherein the field-plate dielectric layer is adjacent to the source region.

14. The field-plate trench FET of claim 1, further comprising:
a dielectric layer, formed to cover the trench and the gate contact.

15. A field-plate trench FET, comprising:
a drain region of a first conductivity type;
an epitaxial layer of the first conductivity type formed on the drain region;
a source region of the first conductivity type formed in the epitaxial layer;
a trench filled with a gate conductive layer and a field-plate dielectric layer, wherein the field-plate dielectric layer is formed on vertical sidewalls of the trench, and the gate conductive layer is electrically isolated from the source region by the field-plate dielectric layer;
a well region of a second conductivity type formed below the trench;
a source contact formed on the source region; and
an independent well contact formed on the well region, the well region is capable of being independently biased by the well contact; wherein
the well region is isolated from the gate conductive layer by the field-plate dielectric layer.

16. The field-plate trench FET of claim 15, wherein the gate conductive layer is formed below a top surface of the source region.

17. The field-plate trench FET of claim 15, wherein the gate conductive layer is formed at or below a bottom of the source region.

18. The field-plate trench FET of claim 15, wherein the trench is configured to be a U-shaped trench with higher than 86° slope of the vertical sidewalls.

19. The field-plate trench FET of claim 15, wherein the field-plate dielectric layer comprises silicon oxide, and the gate conductive layer comprises polysilicon.

20. The field-plate trench FET of claim 15, wherein the field-plate dielectric layer is adjacent to the source region.

21. The field-plate trench FET of claim 15, wherein a gate control of the field-plate trench FET is configured to be performed with a lateral channel depletion.

22. The field-plate trench FET of claim 15, wherein the field-plate dielectric layer is formed between the gate conductive layer and the source region.

* * * * *